(12) United States Patent
Roth et al.

(10) Patent No.: US 6,628,172 B1
(45) Date of Patent: Sep. 30, 2003

(54) FREQUENCY SYNTHESIZER INCLUDING PLL WITH FRACTIONAL DIVISION

(75) Inventors: Alexander Roth, Dorfen (DE); Georg Ortler, Gessertshausen (DE)

(73) Assignee: Rhode & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 09/958,058
(22) PCT Filed: Aug. 3, 2000
(86) PCT No.: PCT/EP00/07543
§ 371 (c)(1), (2), (4) Date: Jan. 10, 2002
(87) PCT Pub. No.: WO01/11784
PCT Pub. Date: Feb. 15, 2001

(30) Foreign Application Priority Data

Aug. 9, 1999 (DE) .......................................... 199 37 608

(51) Int. Cl.⁷ ................................................. H03L 7/00
(52) U.S. Cl. ........................... 331/1 A; 331/16; 331/25; 327/105; 327/107; 327/156; 327/159
(58) Field of Search ............................ 331/18, 25, 1 A, 331/16; 327/105, 107, 156, 159; 377/48

(56) References Cited

U.S. PATENT DOCUMENTS 5,847,615 A * 12/1998 Roth ............................ 331/16

* cited by examiner

Primary Examiner—Arnold Kinkead
(74) Attorney, Agent, or Firm—McDermott, Will & Emery

(57) ABSTRACT

A digital compensation filtering technique is provided that enables indirect phase locked loop modulation with a digital modulation data stream having a bandwidth that exceeds, perhaps by an order of magnitude, the bandwidth characteristic of the phase locked loop. A modulation data receiver is provided for receiving from a modulation source digital input modulation data having a bandwidth that exceeds the cutoff frequency characteristic of the phase locked loop frequency response. A digital processor is coupled to the modulation data receiver for digitally processing the input modulation data to amplify modulation data at frequencies higher than the phase locked loop cutoff frequency. This digital processor is connected to the phase locked loop frequency divider to modulate the divider based on the digitally-processed input modulation data, whereby a voltage controlled oscillator of the phase locked loop is controlled to produce a modulated output carrier signal having a modulation bandwidth that exceeds the phase locked loop cutoff frequency. The digital processing of the modulation data can be implemented by adapting a digital FIR Gaussian transmit filter such that its filter characteristic reflects the intended modulation data amplification as well as enables Gaussian Frequency Shift Keyed modulation. With this implementation, no additional componentry beyond the PLL system is needed to implement the digital modulation data processing provided by the invention.

7 Claims, 3 Drawing Sheets

FREQUENCY SYNTHESIZER INCLUDING PLL WITH FRACTIONAL DIVISION

FIELD OF THE INVENTION

The invention concerns a frequency synthesizer which functions according to the principle of fractional frequency synthesis, according to the pre-characterizing clause of the main claim.

BACKGROUND OF THE INVENTION

Synthesizers of this type are known in the art (e.g. according to published patent specification 196 40 072). In the case of the known synthesizers, the integrator consists of several series-connected integrating circuits, in the feedback loop of which are disposed limiters or evaluation elements. These limiters or evaluation elements are necessary to reduce the control gain to the extent that the closed-loop control circuit is stable. This, however, also reduces the suppression of the quantization noise close to the carrier, this suppression being defined by the gain of the open control loop.

SUMMARY OF THE INVENTION

The object of the invention is to create a synthesizer of the initially stated type which has a stable closed-loop control circuit and still has a loop gain which is as high as possible.

This object is achieved by a frequency synthesizer according to the main claim. Advantageous developments are disclosed by the sub-claims.

In the case of the frequency synthesizer according to the invention, the use of known IIR low-pass filters permits both a high loop gain and a stable closed-loop control circuit without increasing the modulation on the frequency divider more than is necessary. Limiting elements in the feedback loop are avoided, the integer component of the correction value being reinjected directly to the input. IIR (Infinite Impulse Response) filters are known in the art and are described more fully in, for example, the book by H. Götz, Einführung in die digitale Signalverarbeitung (Introduction to Digital Signal Processing), Teubner Studienskripten, page 220. Due to the fine adjustment capability of the multipliers of the IIR filters, it is possible to achieve optimum adjustment of the control characteristic and, consequently, a maximally high loop gain which, in turn, permits optimum suppression of the quantization noise close to the carrier without increasing the modulation on the frequency divider more than is necessary. The small amount of modulation on the frequency divider permits the adjusting of very small division factors, this in turn affording advantages in respect of the phase noise and the adjustment speed. Through optimization of the phase response and attenuation characteristic, the control loop can be designed so that a stable closed-loop control circuit is achieved. The noise profile of the quantization noise can be appropriately adjusted through the selected filter coefficients. The order of the filter is determined by the quantity of registers and multipliers. With a second-order filter, for example, it is possible to achieve a reduction of the quantization noise on the carrier at a rate of approximately 20 dB per decade, and a reduction of 40 dB per decade with a third-order filter, etc. In principle, the order of the filter can be increased as required as long as the rating rules for closed-loop control circuits are observed, i.e., the phase shift in the proximity of the control bandwidth must be less than 180°.

BRIEF DESCRIPTION OF THE INVENTION

The invention is explained more fully below with reference to schematic drawings relating to an embodiment example, which FIG. 1 is a block circuit diagram of a frequency synthesizer;

DETAILED DESCRIPTION

Figure 1:
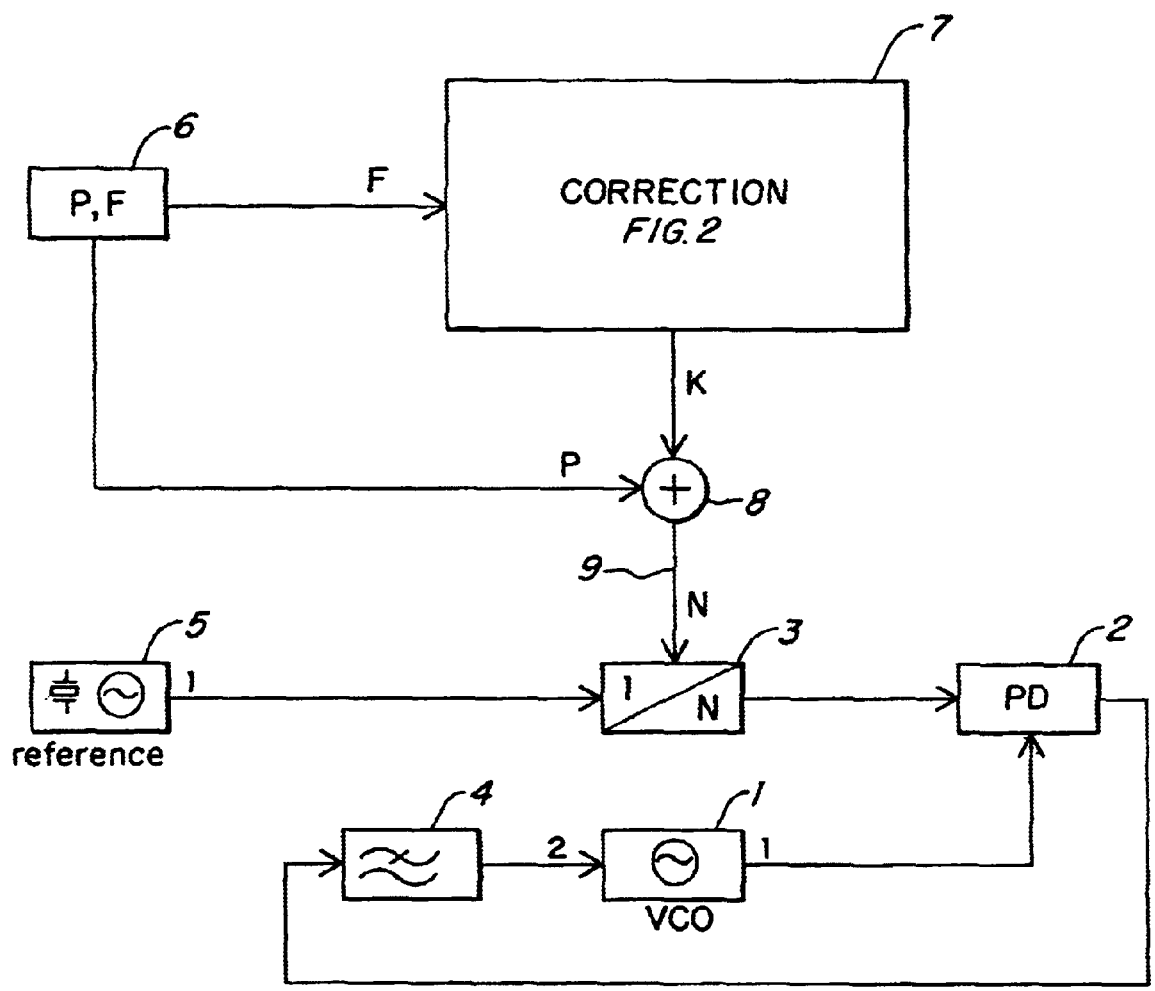

FIG. 1 shows the block circuit.diagram of a frequency synthesizer which functions according to the principle of fractional frequency synthesis, with the fractional frequency divider 3 located in the reference branch. The synthesizer consists of a phase-regulated oscillator 1, a phase detector 2 and a loop filter 4 disposed in the control line between the phase detector 2 and the adjustable-frequency oscillator 1. Disposed between a reference frequency source 5 and the phase detector 2 is the fractional frequency divider 3, which can be adjusted to integral division ratios N. The reference frequency $f_r$ is divided by this frequency divider 3 by the factor N to a frequency $f_t$ and compared in the phase detector 2 with the output frequency $f_o$ of the oscillator 1 which is divided, if necessary, by a further frequency divider which is not represented. The division ratio N of the frequency divider 3 is adjusted via a control circuit 7 which, in turn, is controlled via an adjusting device 6. A desired fractional rational division ratio P, F, with an integral component P and a fractional component F, can be adjusted as a corresponding digital value in the adjusting device 6. In the control circuit 7, which is described more fully in FIG. 2, there is produced from the fractional component F a correction value K which is added to the integral component P in an adder 8. The factor N of the frequency divider 3 is adjusted with the output signal 9 of this adder 8.

Figure 2:
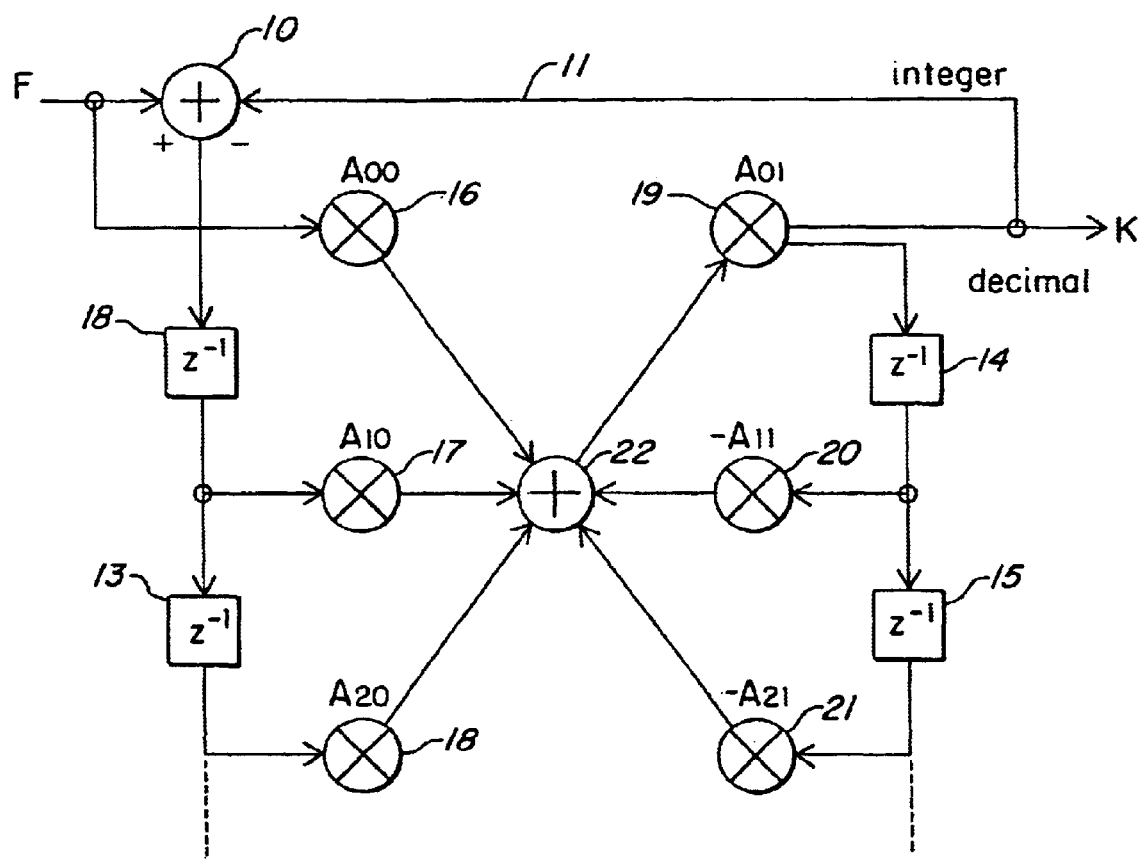
FIG. 2 is a functional diagram of the control circuit of FIG. 1.

FIG. 2 shows details of the control circuit 7, in which the fractional component F of the adjusted desired division ratio is integrated. As shown in FIG. 2, this is effected by means of a known IIR low-pass filter which, in the embodiment example shown, is in the form of a second-order IIR low-pass filter. The fractional component F of the desired division ratio is delivered to an adder 10 where the integrated integral correction value K produced at the output of the filter is added via the feedback line 11. The difference between the reinjected correction value K and the input.signal F is delivered to the first register 12 of the filter. The input signal F is delayed by the registers 12 to 15 and, weighted by the multipliers 17, 18, 20, 21, added to the likewise weighted input signal F. The registers 12 to 15 are designed as delay elements which delay the signals by one clock pulse in each case. The transfer function of such an IIR low-pass filter is given by the coefficients.A as follows:

$$\frac{A_{00} + A_{10} \cdot z^{-1} + A_{20} \cdot z^{-2} + \dots}{A_{01} + A_{11} \cdot z^{-1} + A_{21} \cdot z^{-2} + \dots}$$

The filter characteristic is thus adjusted solely by means of the coefficients at the multipliers.

In practice, the coefficients $A_{00}$ and $A_{01}$, are expediently made equal to 1, which creates the possibility of producing the correction values K directly from the integer value of the adder 22. Only the decimal component of the integrated value of the input signal F is processed in the register 14, this having the same effect as if the integer component were again subtracted immediately through a direct feedback. For the register 12, the integer component of the correction value K is subtracted from the input signal F in the adder 10, the difference being received by the register 12 synchronously with the control clock pulse.

Figure 3:
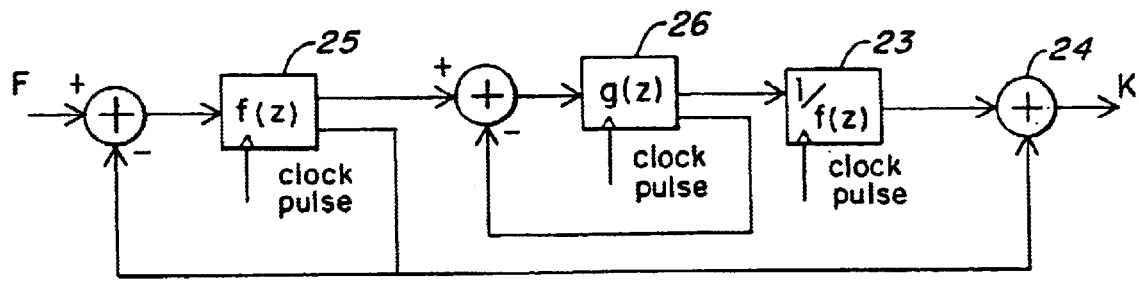
FIG. 3 is a block diagram of a closed loop control circuit.

The bit widths of the multipliers 16, 17,18 are substantially less critical than the bit width of the multipliers 19 to 21, through which the gain is determined in the case of low frequencies and, consequently, the suppression of the quantization noise. In addition, for an adequate frequency activation, a bit width of approximately 40 bits must be allowed for the fractional component F. For these reasons, it is advantageous to connect ahead of the filter shown in FIG. 2 an additional integrator 25 or a further IIR low-pass filter of lower order but high bit width with its own closed-loop control circuit, as shown in FIG. 3. For the succeeding IIR low-pass filter 26, a bit width of 16 is then sufficient to achieve a suppression of the quantization noise to 150 dB. The correction values of the second closed-loop control circuit may only be added to the values of the first closed-loop control circuit following the formation of the inverse function by the first closed-loop control circuit, as indicated by the inverting stage 23, since the first closed-loop control circuit 25 adjusts to its output signal. Following formation of the inverse function in this inverting stage 23, the addition with the output value of the first closed-loop control circuit, to form the total correction value K, is then effected in the adder 24.

Figure 4:
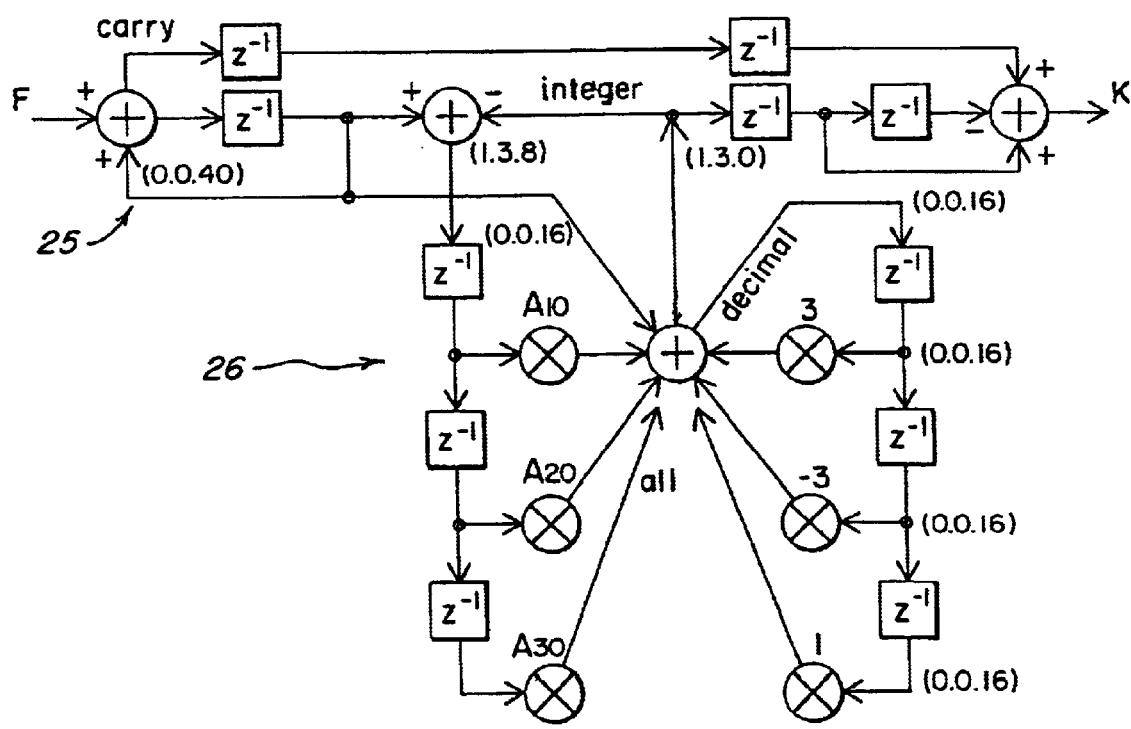
FIG. 4 is a functional diagram of an integration loop control circuit.

FIG. 4 shows the overall circuit of such an integration loop with an integrator pre-connected according to FIG. 3 and a succeeding third-order IIR filter. The suppression of the quantization noise thus corresponds to that of a quadruple integration. The width of the first adder is 40 bits. Neither an integer nor a sign bit is required. The carry bit determines, as in the case of a single integration, when a correction value is output.

The principle according to the invention can be applied both in the case of synthesizers which-have the frequency divider in the reference branch, as in the embodiment example, and in the case of synthesizers in which the divider is disposed in the control loop between a phase-regulated oscillator and a phase detector.

What is claimed is:

1. A frequency synthesizer which functions according to the principle of fractional frequency synthesis, comprising:

a phase-regulated oscillator (1), a phase detector (2), a reference frequency source (5), a frequency divider (3) which can be adjusted to an integral division ratio (N), an adjusting device (6) in which a desired fractional rational division ratio (P, F) of the frequency divider (3) is adjustable as a digital value, and a control circuit (7) including an integrator, the output of which is a correction value (K) that is added to an integral component (P) of the desired fractional division ratio (P, F) so as to produce a corrected output value (9), the integral division ratio (N) of the frequency divider (3) being controlled with the corrected output value (9) in such a way that a fractional division ratio corresponding to a fractional component (F) of a desired division ratio is simulated and a phase noise of the output frequency close to a carrier, resulting from a periodic changeover of a division ratio, is simultaneously reduced, characterized in that a first-order or higher-order IIR low-pass filter is used as an integrator, of an integrated value produced at an output of the IIR filter, the integral component is reinjected to an input (10) of the low-pass filter and provided as the correction value (K) and a difference between the correction value (K) and the fractional component (F) is delivered to a first register (12) of the IIR low-pass filter.

2. The frequency synthesizer according to claim 1, characterized in that of the integrated value produced at the output of the IIR low-pass filter, the decimal component is delivered to a second register (14) of the IIR low-pass filter.

3. The frequency synthesizer according to either of claim 1 or 2, characterized in that several first-order or higher-order IIR low-pass filters are connected successively in a series and the correction value (K) from an output of the last IIR low-pass filter of the series is reinjected to an input of the series.

4. The frequency synthesizer according to either of claim 1 or 2, characterized in that several first-order or higher-order IIR low-pass filters are connected successively in series and the correction value for each individual low-pass filter is reinjected from its output to the input.

5. The frequency synthesizer according to claim 4, characterized in that there is connected in series ahead of the first-order or higher-order IIR low-pass filters a further integrator (25) or a further IIR low-pass filter of lower order having a bit width greater than a succeeding IIR low-pass filter (26).

6. The frequency synthesizer according to claim 1, characterized in that the IIR low-pass filters are designed as amplifying filters.

7. The frequency synthesizer according to claim 1, characterized in that the IIR low-pass filters are rated in such a way that they have a stable feedback closed-loop control circuit.

* * * * *